US006894899B2

(12) United States Patent
Wu et al.

(10) Patent No.: US 6,894,899 B2
(45) Date of Patent: May 17, 2005

(54) INTEGRATED FLUID COOLING SYSTEM FOR ELECTRONIC COMPONENTS

(75) Inventors: Bo Jiu Wu, Hong Kong (HK); Jia Ju Zhang, Wuhan (CN); Zhong Ming Wu, Guangdong (CN)

(73) Assignee: Hong Kong Cheung Tat Electrical Co. Ltd., Hong Kong (HK)

( * ) Notice: Subject to any disclaimer, the term of this patent is extended or adjusted under 35 U.S.C. 154(b) by 3 days.

(21) Appl. No.: 10/290,610

(22) Filed: Nov. 7, 2002

(65) Prior Publication Data

US 2004/0052049 A1 Mar. 18, 2004

Related U.S. Application Data

(63) Continuation-in-part of application No. 10/243,413, filed on Sep. 13, 2002, now abandoned.

(51) Int. Cl.⁷ .............................................. H05K 7/20
(52) U.S. Cl. ..................... 361/699; 165/80.4; 165/185; 361/703; 361/701
(58) Field of Search ............................... 165/80.2–80.4, 165/185, 104.22, 104.26, 104.33–104.36; 257/706–707, 712–716; 361/687–689, 696–703, 715, 717–718, 722

(56) References Cited

U.S. PATENT DOCUMENTS

| 6,019,165 | A | * | 2/2000 | Batchelder | 165/80.3 |
| 6,021,844 | A | * | 2/2000 | Batchelder | 165/80.3 |
| 6,029,742 | A | * | 2/2000 | Burward-Hoy | 165/80.4 |
| 6,166,907 | A | * | 12/2000 | Chien | 361/699 |
| 6,175,495 | B1 | * | 1/2001 | Batchelder | 361/695 |
| 6,377,458 | B1 | * | 4/2002 | Morris et al. | 361/699 |
| 6,408,937 | B1 | * | 6/2002 | Roy | 165/104.33 |
| 6,422,304 | B1 | * | 7/2002 | Slovikosky | 165/80.4 |

* cited by examiner

Primary Examiner—Gregory D. Thompson
(74) Attorney, Agent, or Firm—Baker & McKenzie LLP

(57) ABSTRACT

An improved cooling system designed for electronic components such as a central processing unit of a computer with an integrated unit comprising a radiation housing, an absorption housing having a coolant store unit, an absorption layer between the coolant store unit and the electronic component and a circulation generation unit which causes a coolant to flow from the coolant store unit to the absorption layer and back to the coolant store unit through a conduit.

17 Claims, 7 Drawing Sheets

INTEGRATED FLUID COOLING SYSTEM FOR ELECTRONIC COMPONENTS

CROSS-REFERENCE TO RELATED APPLICATION

This is a continuation-in-part of application Ser. No. 10/243,413 entitled "Integrated Fluid Cooling System for Electronic Components", filed on 13 Sep. 2002 now abandoned.

BACKGROUND OF THE INVENTION

The present invention relates to a fluid cooling system designed for electronic components, with radiation and absorption incorporated in an integrated unit, and more particularly, to a central processing unit ("CPU") radiator with internal circulation integral mode liquid cooling system.

During the past decades technologies in electronics have improved tremendously. Devices such as microprocessors have been become one of the major electronic components in many products such as TVs, radios, home appliances and computers and gradually become part of people's daily life. Transistors enabled people to make microprocessor more reliable, consume less power and have a higher working speed. Further developments of the integrated circuits (ICs) allowed multiple electronic circuits to be combined on the same chip. Since then, chip manufacturers tend to reduce the overall size of the microprocessors and concurrently increase the total number of transistors therein.

Like many electronic devices, microprocessors have a range of operating temperature, below which the device would function well. Exceeding the operating temperature or an excessively high temperature would adversely effect the overall performance of the device. Exceeding continuously the operating temperature for a certain amount of time would result in device failure or damage. It is therefore understood that thermal management in present-day electronics plays a very important role, particularly when heat is generated during operation. The CPU produces heat during the operation of the computer. Heat must be quickly carried away from the CPU during the operation of the computer.

Conventionally, thermal control is achieved by using a fan to provide ambient air to the device. This type of cooling system generally requires a large surface area so that more air can be directed to the device. However, manufacturers tend to develop chips in a compact size such cooling system certainly does not meet the need. Other drawbacks of this type include slow heat transfer and energy-inefficient.

Alternatively, a cooling system with water other than air can be used, and can be refrigerated rather than at ambient temperature. Such cooling systems include those designed as separate compartments, i.e., units for radiation and absorption. With such segregated components, leakage, slow and unstable circulation resulted thereby leading to inefficient heat transfer. For example, U.S. Pat. No. 6,422,304 discloses an auxiliary cooling system for cooling a central processing unit (CPU) which includes an inner tube provided within an outer tube. A first end of the outer tube is attached to a fan and a second end of the outer tube is attached to a housing of a computer adjacent the CPU. Inlet and outlet tubes are attached to a first end and second end of the inner tube. A pump draws a cooling fluid from a cooling source and passes the cooling fluid to the inner tube. As the cooling fluid passes through the inner tube, the temperature of the air within the outer tube is decreased. A fan is used to direct the cool air onto the CPU.

Other cooling means have been developed previously for dissipating heat from the CPU of a computer. For example, a structure of CPU cooling arrangement comprises a heat sink mounted on the CPU, the heat sink having a plurality of bottom mounting legs inserted through respective through holes on the CPU, a spring retainer fastened to the bottom mounting legs of the heat sink to secure the heat sink and the CPU together, and a fan mounted on the heat sink. However, low performance and inefficient dissipation of hot air resulted.

Similarly, U.S. Pat. No. 6,166,907 discloses a CPU cooling system for use in a computer to dissipate heat from the CPU of the computer comprising a water tank holding a liquid coolant, radiators, a water circulation pipe assembly for circulation of the liquid coolant through the radiators, and a pump external to the water tank whereby the liquid coolant is pumped through the water circulation pipe assembly. However, as the above prior art system has separate compartments, more efficient radiation is desirable.

Although use of water may remove the heat and reduce the temperature produced by electronic components, there is still a need for the development of a stable, rapid, high energy efficient, small capacity, impact resistant and leakage-free cooling system.

The present invention meets this need.

SUMMARY OF THE INVENTION

An improved cooling system designed for electronic components provides a stable, rapid, high energy efficient, small capacity, impact resistant and leakage-free cooling system comprising a coolant and an integrated unit comprising: (i) absorption housing having a coolant store unit; (ii) a radiation housing having a plurality of radiation sheets; (iii) an absorption layer between the coolant store unit and the electronic component; and (iv) a circulation generation unit having a brushless DC motor, motor stator, a top cover of the coolant store unit to prevent leakage of the coolant, rotor and an impeller, which causes the coolant to flow from the coolant store unit to the absorption housing and back to the coolant store unit through a conduit.

Details of one or more embodiments of the invention are set forth in the description below. These embodiments are for illustrative purposes only and the principle of invention can be implemented in other embodiments. Other features and advantages of this invention will become apparent from the following description.

BRIEF DESCRIPTION OF THE DRAWINGS

For the purpose of illustrating the invention, there is shown in the accompanying drawings one form which is a preferred embodiment; it being understood that the invention is not intended to be limited in scope as shown.

DETAILED DESCRIPTION OF THE INVENTION

Figure 1:
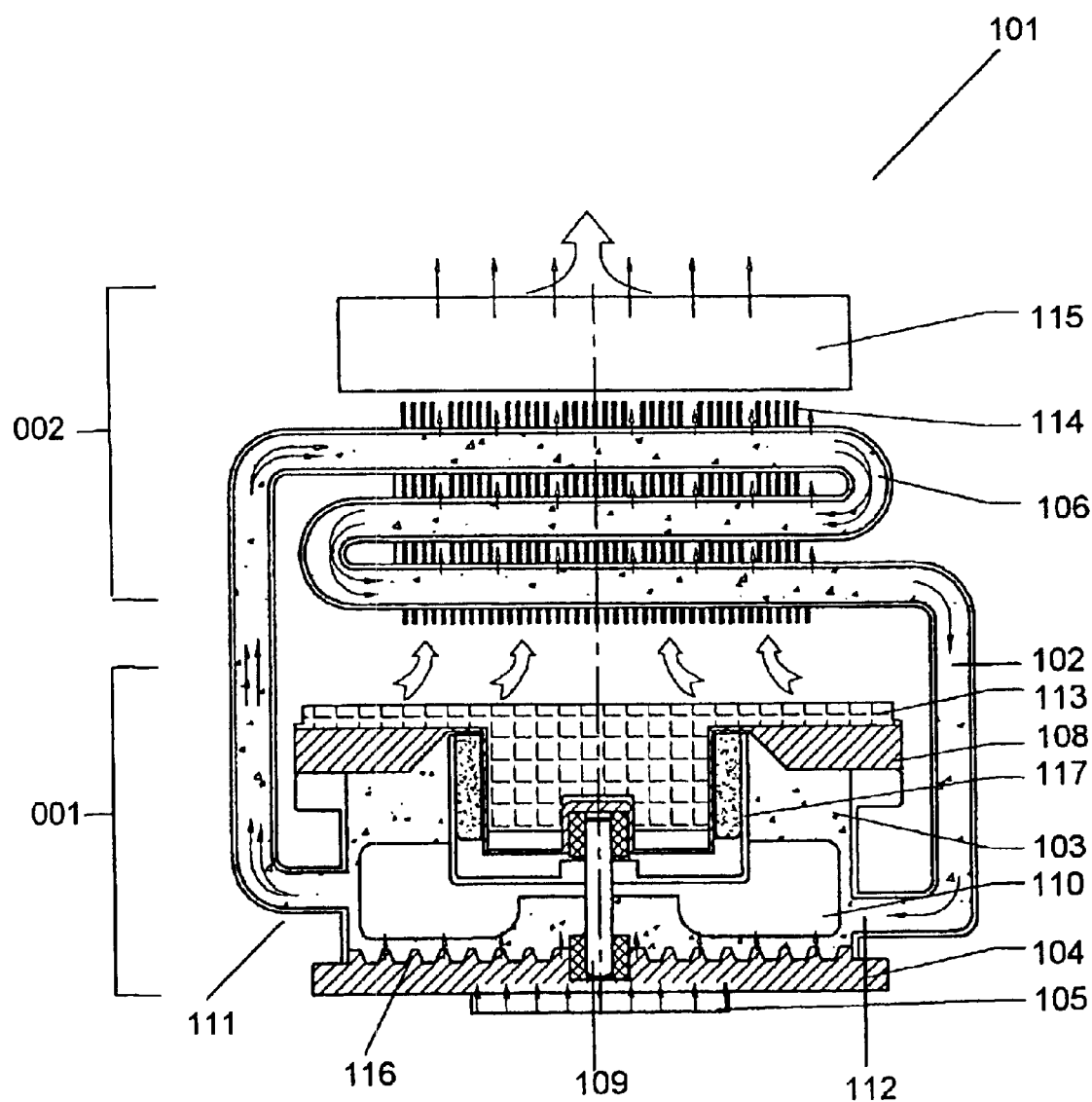
FIG. 1 is a schematic, cross sectional view of the cooling system according to the present invention.

The present invention is an improved cooling system designed for electronic components such as a central processing unit (CPU) of a computer, super power tube, integrated chip, or the like and any similar electronic devices that use a radiation sheet for heat transfer or thermal management. One preferred embodiment is directed to a cooling system, i.e., radiating system designed for a CPU comprising a coolant (102) and an integrated radiation housing and absorption housing or section. It is contemplated that the radiator unit may be positioned relative to the absorption unit in various ways, e.g., horizontally and connected to at least one part of the water tank; or vertically. For example, the radiation unit is mounted on the absorption section. The absorption section (001) of the cooling system comprises an absorption layer (104), coolant storage unit (103), a circulation generation unit and a conduit (106). The absorption layer forms the base of the coolant storage unit (103) and the CPU (105). The conduit is attached to the coolant storage unit at the outlet (111) and the inlet (112). The circulation generation unit comprises an impeller (110), a rotor (117), a top cover (108) of the coolant storage unit (103) and a motor stator (113). The impeller erects or is positioned at the center of the absorption layer. The radiation section (002) includes a fan/blower (115), conduit (106) and a plurality of radiation sheets (114) preferably about 30 to 50 radiation sheets. The coolant storage unit (103) and the conduit (106) are filled with a coolant (102). The cooling system is placed directly above the electronic device and has the same or similar power supply as that of the device, the CPU, for example, 12V DC. When the CPU is in its operation and generates heat, the heat will be absorbed into the absorption layer and transferred to the coolant (102).

Another embodiment of the present invention comprises all the components as stated heretofore but with the radiation unit positioned at the same level as the absorption unit As used herein, integral mode internal circulation refers to an integral body with units such as, for example, absorption layer, coolant storage unit and power pump and radiator. The circulation generation unit, that is, a power pump comprises an impeller, rotor, coolant storage unit top cover and motor stator. The radiator comprises a conduit, at least one radiating sheet and fan. The present invention forms a closed internal circulation cooling system for controlling the velocity of radiation in electronic devices, and preferably in CPUs and internet networking master board with increased power efficiency, for example, 1000 W–2000 W. The coolant storage unit, power pump and radiator joined together by welding.

Another embodiment is directed to the process of cooling. More specifically, the CPU (105) triggers the cooling system (101) when it is in operation and generates heat. The absorption layer of the cooling system absorbs the heat generated by the CPU as they are in contact or direct contact. The coolant (102) in the coolant storage unit (103) in turn absorbs the heat from the absorption layer. At the same time, the circulation generation unit operates causing the coolant to flow thereby generating circulation of the coolant. The heated coolant will start to flow out from the outlet (111) to the conduit (106) thereof extends into the radiation section of the cooling system where a fan/blower (115) directs ambient air from the surroundings, particularly from the area above top cover of the coolant storage unit to refrigerate the heated coolant. The conduit in the radiation section is circulated cylindrically which aims to maximize the flowing length as well as the cooling time for the heated coolant. The temperature of the heated coolant will be reduced to normal or lower than normal by the time it flows out of the radiation section and returns to the coolant storage unit at the inlet (112) where the coolant again absorbs the heat from the absorption layer (104) as well as the CPU. Each junction point is closely welded thereby forming an internal circulation system. The process repeats, hence the internal circulation, until the CPU is being turned off, during which the operating temperature of the CPU can be controlled significantly.

Now referring to the drawings, there is shown one embodiment, it being understood that the invention is not intended to be limited in scope as shown.

FIG. 1 illustrates the cross-sectional view of one embodiment of the present invention. The cooling system (101) comprises a coolant (102) and an integrated radiation housing or section and absorption housing having a coolant storage unit (103) in absorption section, an absorption layer (104) between the coolant storage unit and the CPU (105) and a conduit (106). The cooling system (101) is mounted on the top of the CPU with four fixing screws with the absorption layer in direct contact with the CPU as well as the coolant (102). The cooling system (101) has the same power supply (not shown) as that of the CPU (105), typically 12V DC, so when the CPU is in operation in which heat is generated, the cooling system (101) will be turned on. As shown in FIG. 1, the absorption layer (104) is the base of the cooling system (101) and in order for the absorption layer (104) to absorb heat from the CPU quickly it is made of materials having a high heat conductivity such as bronze, copper (preferably red copper tube), aluminum and the like or alloys thereof. It will be appreciated that any thermally conductive material is contemplated. Further contemplated equivalents include mixtures of plastic and copper powder or the like. The other side of the absorption layer, the side that is in contact with the coolant, is made with a number of grooves (116) to increase the contact area between the coolant and the absorption layer so that more heat can be transferred about quickly. The absorption layer in the preferred embodiment has about 10 to 20 grooves and more preferably, about 10 to 15 grooves. The absorption layer optionally may have at least one grove bent in the same angle as the rotation. This may accelerate the process of mixing up the heated coolants and refrigerated coolant as further described below. The grooves (116) on the absorption layer is in a form of concentric circles which serves as a diversion channels guiding the heated coolant to mix with the cooled coolant returned from the radiation section thereby increasing the ability of heat conductivity from the surface of the absorption layer to the coolant by about 1.5–3 times. Also, the diversion channel guides the coolant to flow in the same direction thereof can reduce the interruption of friction between the viscosity of the coolant eliminating the problems such as streamline distortion and swirl. Two mixing regions are created on the base by not having any grooves on the area. The mixing region is a sector having an angle of at least about 20°. Under the effect of centrifugal force, the coolant in these mixed regions will tend to travel outward. As the area closer to the center of the absorption layer usually has a higher temperature than those away from the center, the coolant closer to the center can mix with those away from the center with a lower temperature in the mixing region. As a result, it accelerates the heat transfer process. The coolant of the cooling system is a fluid selected from a group consisting of gas, liquid or mixtures thereof. Any liquid such as water ($H_2O$), ammonia ($NH_3$), transformer oil, fluorinated organic compounds, ethylene glycol and mixtures thereof, or which possess a high specific heat capacity and coefficient of thermal conductivity as well as a lower boiling point than an operating temperature of the CPU is contemplated. The coolant store unit comprises the coolant and a fan-like circulation generation unit comprising a brushless DC motor as supplied by Hong Kong Cheung Tat Electrical Co., Ltd., Hong Kong and an impeller. Preferably, the brushless DC motor is specially designed where the motor stator (113) and the rotor (117) is separated by a non-magnetized top cover (108) of the coolant storage unit. Preferably, the rotor is placed inside the coolant storage unit whereas the motor stator is situated outside. When the cooling system is triggered by the operation of the CPU, the stator produces a magnetic field inducing the rotor as well as the impeller to rotate causing the coolant to flow. The heated coolant in the coolant storage unit will flow into the conduit at the outlet whilst the coolant at the inlet flows into the coolant store unit. The impeller (110) is made of aluminum or equivalent material and comprises an axis (109) and at least one blade. The impeller (110) is designed with the bottom part, thereof constitutes about one-third of the blade, slightly bent at an angle towards the direction of rotation making it a shape of an arc. This special design enhances the heat transfer process by creating a lifting force for the coolant at the bottom part of the coolant storage unit. It is believed that the temperature at the surface the absorption layer is generally higher than that away from it. Therefore, the coolant at the bottom part of the coolant storage unit will possess a higher temperature or absorbs heat quicker than those in the upper part. The function of the bent impeller is to create a lifting force for the coolant closer to the absorption layer to raise and mix with the lower temperature coolant in the upper part of the coolant storage unit thereby enhancing the heat transfer between the coolant within the coolant storage unit. The top cover (108) is designed to prevent the coolant from leakage from the coolant storage unit. The impeller (110) is erected or positioned at the center of the absorption layer. The conduit is made of high heat conductivity material such as copper, preferably red copper tube, which is attached to the coolant storage unit and extended into the radiation section. The conduit winds its way or circumnavigates into the radiation unit and connects integrally back to the coolant storage unit. The connection point for the inlet conduit is made at the bottom part of the coolant storage unit whereas the connection point for the outlet conduit is made at a slightly higher position of the coolant storage unit. The conduit is connected to the inlet and outlet of the coolant storage by way of a welding process. The coolant returned from the radiation housing will enter the coolant store unit at a region where the temperature is high. On the other hand, the heated coolant lifted by the blade of the impeller to a higher level can flow out at the outlet. The conduit in the radiation is designed to achieve maximum radiation. For example, in FIG. 1, the conduit is made to circulate to maximize the length of the flow of coolant thereby effectuating maximum radiation. Preferably, the conduit may be a round shape with a diameter of about 6–7 mm with a total length ranging from about 1000 to 1500 mm. One skilled in the art would be able to modify the above parameters depending upon the end use application, miniaturization of electronic components without undue experimentation. As the impeller rotates, the coolant in the coolant storage unit (103) will flow out from the outlet (111) to radiation housing through the conduit (106). In the radiation housing, a fan/blower (115) directs ambient air from the surroundings, particularly from the area above top cover of the coolant storage unit to refrigerate the heated coolant. There are also radiation sheets (114) in the vicinity of the conduit to assist the radiation and to direct the air into the radiation housing. The radiation sheets are made of aluminum foil or the like. The heated coolant continues to circulate as well as refrigerate along the conduit and returns to the coolant storage unit through an inlet which may be positioned at any point around the circumference of the coolant storage unit, preferably the coolant enters in a radial direction and more preferably the coolant enters in a tangential direction. It being understood by those skilled artisans that the entering and exiting coolant flows within the same direction as the rotation of the impeller. When the coolant returns to the coolant storage unit, the temperature should have been reduced to normal or below normal. The refrigerated coolant would again mix with the heated coolant and continue to circulate forming an internal circulation. This process would repeat until the CPU is turned off. For example, the cooling system is able to reduce the operating temperature of the CPU by about 40° C. in about 10 seconds. Also, the cooling system achieves noise-control by at least 20 dB and preferably about 40 dB and small capacity. Furthermore, the power capacity is less than 10 watts depending on the size.

Figure 2:
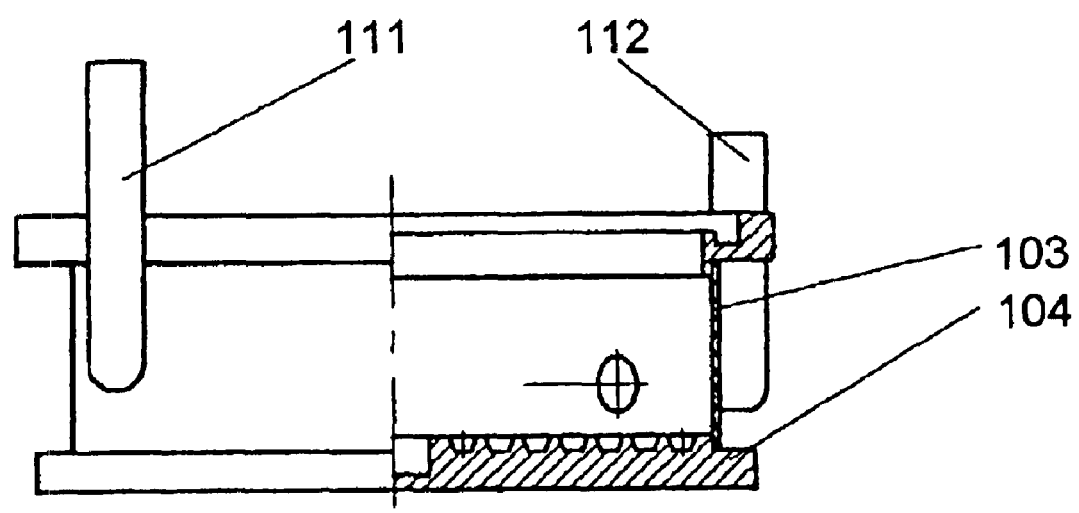
FIG. 2 is a cross sectional view of the coolant storage unit.

Now referring to FIG. 2 is a cross section of the coolant storage unit. The base or absorption layer (104) connects to the coolant storage unit (103) by a welding process. The inlet is placed at a level close to the absorption layer whereas the outlet is situated at a higher position than the inlet. The cover (108) of the coolant storage unit, conduit (106) and outlet (111) are illustrated.

Figure 3:
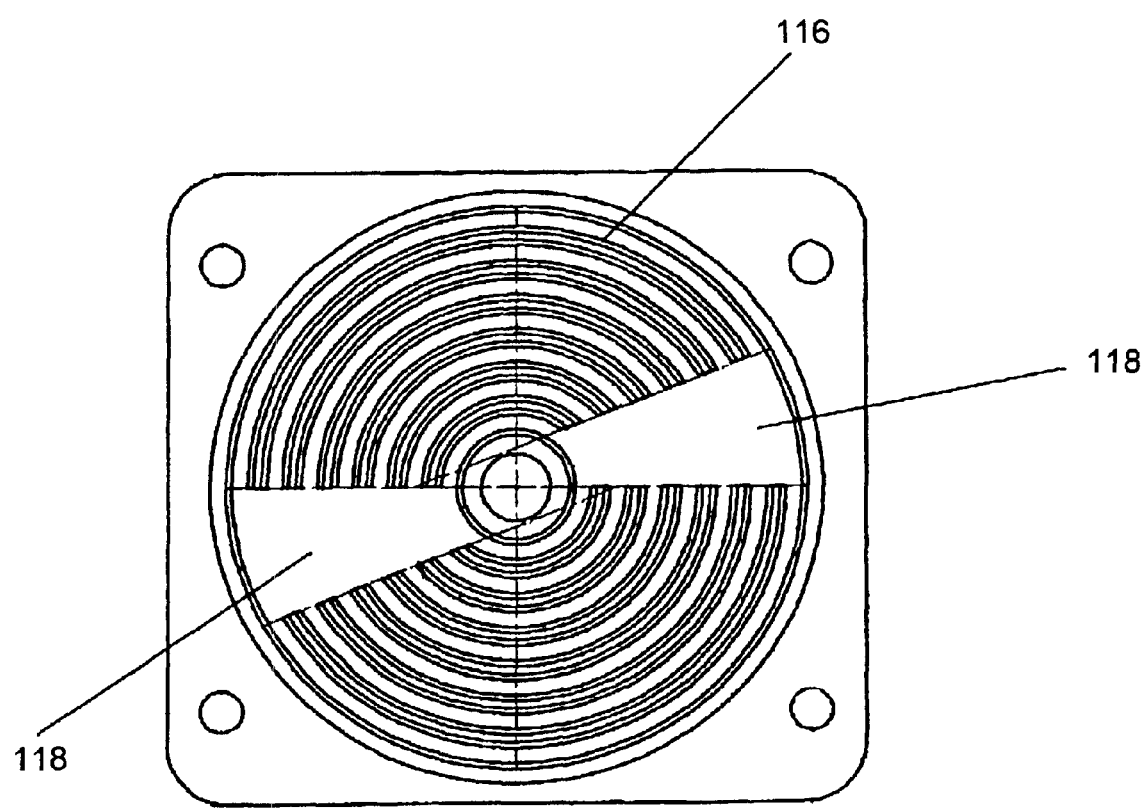
FIG. 3 is a top view of a base, i.e., absorption layer.

Now referring to FIG. 3 is a top view of the base, i.e., absorption layer. The grooves (116) increase the surface area for absorption and are formed in a shape of concentric circles serving as diversion channels. Also the base contains two mixed regions where no groove is displayed. Each mixing regions (118) occupies about 20–22°. The present invention base having few ring type, concentric circles, trapezoid or semicircle diversion channels resulting in a mixed flow area in the region of inflow and outflow liquid tubes. The construction of the inner surface base forming of trapezoid and semicircle channels increases the ability of heat conductivity about 1.5 to 3 times to the area of base and liquid medium material so that rapid heat transfer is effectuated. Furthermore, the base of channels forms various ring type, i.e., concentric circles making the same direction of liquid inflow in the diversion channel and the major part of the water tank thereby reducing the friction between the viscosity of liquid inside the grooves and further solves the problem of streamline distortion and caused swirl. Finally, a mixed flow area is created whereby the liquid in the center part of the groove enters into mixed flow area under centrifugal force moves to the outer groove and the temperature inside the groove is stabilized and efficiently absorbs heat.

Figure 4:
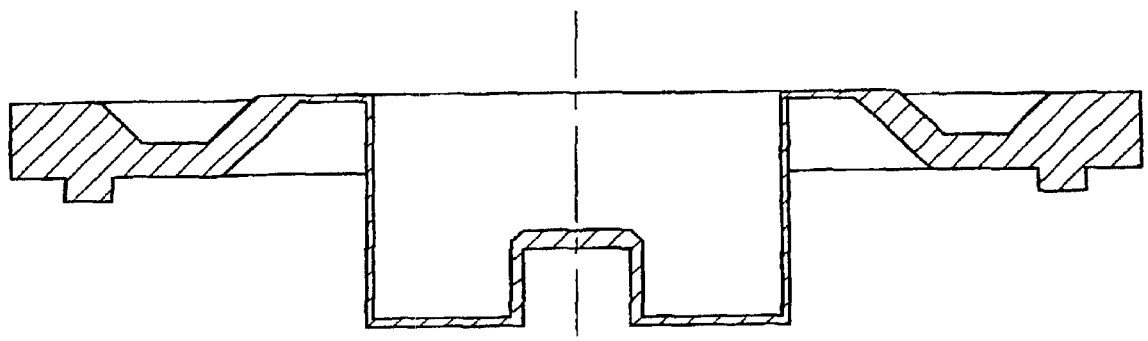
FIG. 4 is a cross sectional view of the cover.

Now referring to FIG. 4 is a side view of the impeller. The bottom part, which constitutes one-third of the blade is bent at an angle towards the direction of the rotation. It is preferred that the impeller is directly installed in the magnetic part of the rotor. The movement of the impeller will be followed by the rotation of the magnetic rotor and the design for the blade of the impeller intersectional shows straight and plan in the upper part and the lower part shows a shape of arc as illustrated in FIG. 4.

Figure 5:
FIG. 5 illustrates the shape of the fan.

Now referring to FIG. 5 is a cross-sectional view of the non-magnetized top cover of the coolant storage unit which separates the motor stator (113) and the rotor (117).

Figure 6:
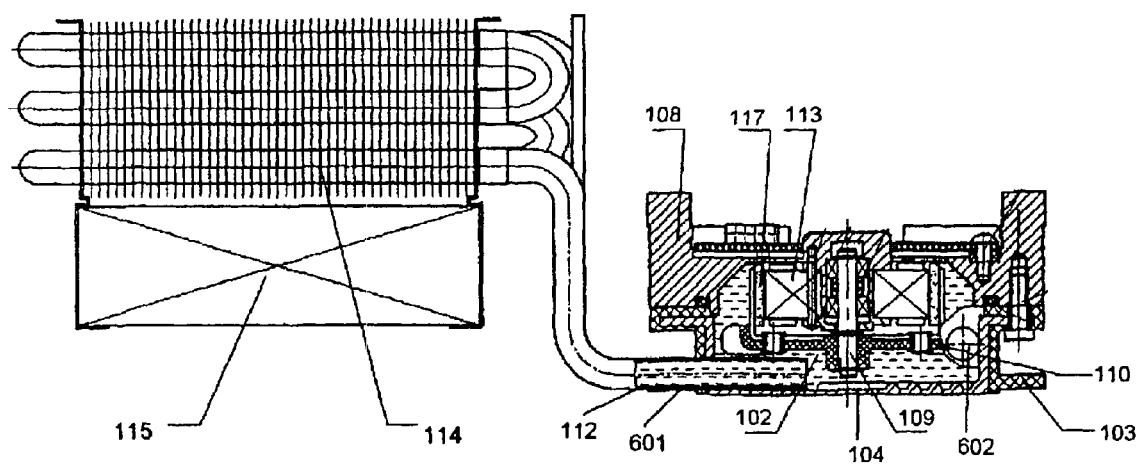
FIG. 6 is a cross section of another embodiment of the present invention.
Figure 7:
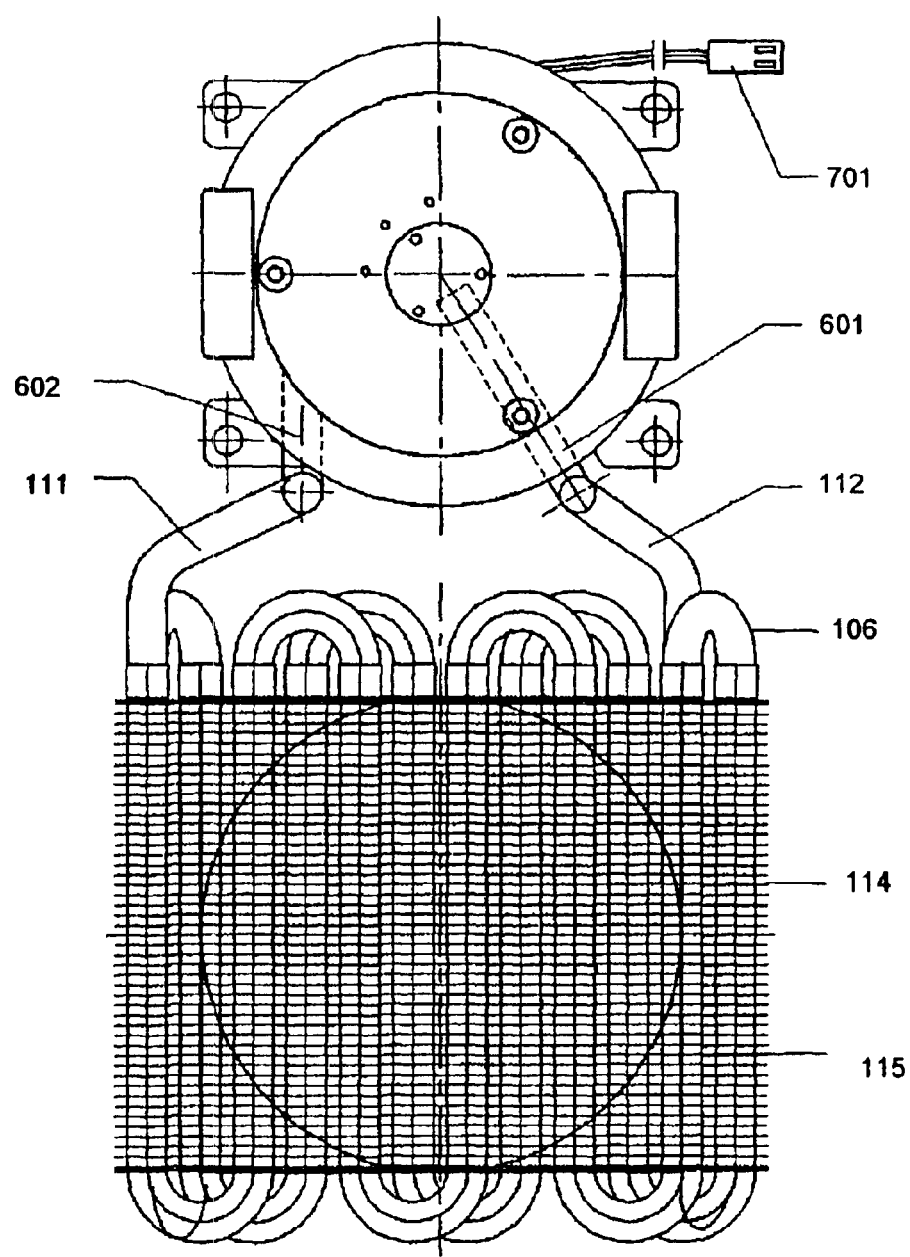
FIG. 7 is a top view of the embodiment shown in FIG. 6 of present invention.

Now referring to FIG. 6 is a cross section of another embodiment of the present invention. In this embodiment, the radiation unit is placed on the same level as the absorption unit with the inflow tie-in (601) and a outflow tie-in (602) inserted into the coolant storage unit. The inflow tie-in as well as the outflow tie-in are connected to the inlet (112) and outlet (111) respectively. The inlet and outlet are then extended into the radiation unit via the conduit (106) surrounded by radiation sheets (114). A fan (115) to direct ambient air into the radiation unit is stationed below said conduit Now referring to FIG. 7 is a top view of the embodiment shown in FIG. 6 of present invention. The radiation unit is situated next to the absorption section. The inflow tie-in (601) is inserted deeply into the coolant storage unit whereas the outflow tie-in (602) only entered slightly in the unit. The inflow tie-in as well as the outflow tie-in are connected to the inlet (112) and outlet (111) respectively. The cooling system (101) is connected to the power supply of the CPU (105), typically 12V DC by virtue of a connector (701).

Those skilled in the art will appreciate that many widely different embodiments of the present invention may be adopted without departing from the spirit and scope of the invention.

What is claimed is:

1. An improved cooling system designed for an electronic component comprising:
   (a) a coolant; and
   (b) an integrated unit comprising: (i) an absorption housing having a coolant storage unit, the coolant storage unit having a cover for preventing leakage of coolant from the coolant storage unit; (ii) a radiation housing having a plurality of radiation sheets; (iii) an absorption layer between the coolant storage unit and the electronic component; and (iv) a circulation generation unit having a brushless DC motor, a motor stator, a rotor separated from the motor stator via the cover, and an impeller which causes the coolant to flow from the coolant storage unit to the radiation housing and back to the coolant storage unit through a conduit.

2. The cooling system of claim 1 wherein the electronic component is selected from the group consisting of a Central Processing Unit (CPU), super power tube, integrated chip (IC) and internet networking master board; and wherein the coolant is a fluid selected from a group consisting of gas, liquid or mixtures thereof.

3. The cooling system of claim 2 wherein the fluid is selected from a group consisting of water ($H_2O$), ammonia ($NH_3$), transformer oil, fluorinated organic compounds, ethylene glycol or mixtures thereof.

4. The cooling system of claim 1 wherein the absorption layer is formed to have a high heat conductivity, the absorption layer being formed of a material selected from a group consisting of bronze, copper (Cu), red copper tube, aluminum (Al), and alloys thereof, and wherein said absorption layer forms a chassis of the cooling system and is in contact with the electronic component and the coolant.

5. The cooling system of claim 4 wherein the absorption layer is a mixture of plastic and copper powder.

6. The cooling system of claim 4 wherein the conduit circumnavigates in the integrated unit and connects an inlet and an outlet of the coolant storage unit so that the coolant flowing out of the coolant storage unit and the coolant flowing into the coolant storage unit is in the same direction as the rotation of the impeller.

7. The cooling system of claim 1 wherein the absorption layer further comprises at least one groove bent in the same angle as the rotation of the impeller.

8. The cooling system of claim 1 wherein the circulation generation unit comprises the same power supply as the electronic component.

9. The cooling system of claim 1 wherein the impeller further comprises an axis and at least one blade having one-third of the bottom part slightly bent at an angle towards the direction of rotation making it a shape of an arc to enhance the heat transfer process by creating a lifting force for the coolant at the bottom part of the coolant storage unit.

10. The cooling system of claim 1 wherein the radiation housing further comprises a fan.

11. The cooling system of claim 1 wherein the top cover is non-magnetic.

12. The cooling system of claim 8 wherein the top cover is non-magnetic.

13. The cooling system of claim 3 wherein the absorption layer is formed to have a high heat conductivity, the absorption layer being formed of a material selected from a group consisting of bronze, copper (Cu), red copper tube, aluminum (Al), and alloys thereof, and wherein said absorption layer forms a chassis of the cooling system and is in contact with the electronic component and the coolant.

14. An improved cooling system designed for an electronic component comprising:
   (a) a coolant; and
   (b) an integrated unit comprising: (i) an absorption housing having a coolant storage unit, the coolant storage unit having a cover for preventing leakage of coolant from the coolant storage unit; (ii) a radiation housing having a plurality of radiation sheets; (iii) an absorption layer between the coolant storage unit and the electronic component; and (iv) a circulation generation unit having a brushless DC motor, a motor stator, a rotor, and a rotatable impeller which causes the coolant to flow from the coolant storage unit to the radiation housing and back to the coolant storage unit through a conduit; wherein the absorption layer includes at least one groove bent in the direction of rotation of the impeller.

15. An improved cooling system designed for an electronic component comprising:
   (a) a coolant; and
   (b) an integrated unit comprising: (i) an absorption housing having a coolant storage unit, the coolant storage unit having a cover for preventing leakage of coolant from the coolant storage unit; (ii) a radiation housing having a plurality of radiation sheets; (iii) an absorption layer between the coolant storage unit and the electronic component; and (iv) a circulation generation unit having a brushless DC motor, a motor stator, a rotor, and an impeller which causes the coolant to flow from the coolant storage unit to the radiation housing and back to the coolant storage unit through a conduit; wherein the circulation generation unit has the same power supply as the electronic component.

16. An improved cooling system designed for an electronic component comprising:
   (a) a coolant; and
   (b) an integrated unit comprising: (i) an absorption housing having a coolant storage unit, the coolant storage unit having a cover for preventing leakage of coolant from the coolant storage unit; (ii) a radiation housing having a plurality of radiation sheets; (iii) an absorption layer between the coolant storage unit and the electronic component; and (iv) a circulation generation unit having a brushless DC motor, a motor stator, a rotor, and a rotatable impeller which causes the coolant to flow from the coolant storage unit to the radiation housing and back to the coolant storage unit through a conduit; wherein the impeller includes at least one blade in which a bottom portion of the at least one blade is slightly bent at an angle towards the direction of rotation of the impeller.

17. An improved cooling system designed for an electronic component comprising:

an absorption section having a coolant storage unit and an absorption layer, the coolant storage unit housing coolant and an impeller, the coolant storage unit further having a cover for preventing leakage from the coolant storage unit, and the absorption layer being disposed between the coolant storage unit and an electronic component;

a radiation section disposed adjacent to the absorption section;

a conduit for connecting the absorption section with the radiation section; and a circulation generation unit disposed within the absorption section, the circulation generation unit having a brushless DC motor comprising a motor stator and a rotor, the motor stator and rotor being separated by the cover;

whereby activation of the circulation generation unit activates the impeller, thereby causing coolant to flow from the coolant storage unit to the radiation section and back to the coolant storage unit via the conduit.

* * * * *